(12) United States Patent
Wu et al.

(10) Patent No.: US 11,831,348 B2
(45) Date of Patent: Nov. 28, 2023

(54) BROADBAND SIGNAL SOURCE ARCHITECTURE

(71) Applicants: Kefei Wu, San Diego, CA (US); Mona Mostafa Hella, Watervliet, NY (US)

(72) Inventors: Kefei Wu, San Diego, CA (US); Mona Mostafa Hella, Watervliet, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 112 days.

(21) Appl. No.: 17/631,026

(22) PCT Filed: Jul. 28, 2020

(86) PCT No.: PCT/US2020/043816
§ 371 (c)(1),
(2) Date: Jan. 28, 2022

(87) PCT Pub. No.: WO2021/021776
PCT Pub. Date: Feb. 4, 2021

(65) Prior Publication Data
US 2022/0271784 A1 Aug. 25, 2022

Related U.S. Application Data

(60) Provisional application No. 62/879,692, filed on Jul. 29, 2019.

(51) Int. Cl.
*H04B 1/04* (2006.01)
*H04L 27/04* (2006.01)
*H04L 27/36* (2006.01)

(52) U.S. Cl.
CPC ........... *H04B 1/0483* (2013.01); *H04L 27/04* (2013.01); *H04L 27/36* (2013.01)

(58) Field of Classification Search
CPC .... H04B 1/0483; H04B 1/40; H04B 1/71635; H04B 1/04; H04B 1/16; H04B 17/104;
(Continued)

(56) References Cited

U.S. PATENT DOCUMENTS 6,724,840 B1 * 4/2004 Osofsky ............... H04B 1/1027
455/304
7,359,455 B1 * 4/2008 Roy ........................ H04L 27/04
375/302

(Continued)

OTHER PUBLICATIONS

International Search Report and the Written Opinion of the International Searching Authority, International Application No. PCT/US2020/043816, dated Nov. 18, 2020.
(Continued)

*Primary Examiner* — Lana N Le
(74) *Attorney, Agent, or Firm* — Murtha Cullina LLP; Anthony P. Gangemi

(57) ABSTRACT

One embodiment provides a broadband signal source. The broadband signal source includes a number, n, signal paths and a combiner circuitry. Each signal path, i, includes a programmable phase shifter circuitry, an amplifier circuitry and a harmonic generation circuitry. The programmable phase shifter circuitry is configured to phase shift a path input signal by a respective phase angle, $\theta_i$. The path input signal corresponds to a source input signal having a fundamental frequency, f, and an input signal bandwidth. The amplifier circuitry is configured to amplify the phase shifted path input signal. The harmonic generation circuitry is configured to generate a path output signal including a plurality of harmonics of the amplified phase shifted path input signal. The combiner circuitry is configured to combine the number, n, path output signals to produce a broadband output signal having an output signal center frequency greater than the input signal fundamental frequency and an
(Continued)

output signal bandwidth greater than the input signal bandwidth.

20 Claims, 3 Drawing Sheets

(58) Field of Classification Search
CPC .......... H04B 2001/0416; H04B 1/7176; H04B
17/101; H04B 7/06; H04B 1/00; H04B
1/708; H04B 1/70753; H04B 7/15578;
H04B 1/66; H04B 7/084; H04B 10/0775;
H04B 2001/1054; H04B 1/71632; H04L
27/04; H04L 27/36; H04L 12/2801; H04L
5/06; H04L 25/08; H04L 27/0002; H04L
27/2601; H04L 2027/0018; H04L
25/03343; H04L 27/0008; H04L 27/20;
H04L 25/02; H04L 25/40; H04L 27/152;
H04L 27/18; H03B 27/00
USPC ..... 455/42, 60, 67.16, 137, 139, 205, 276.1,
455/303, 304, 127.1, 127.3, 127.2, 144,
455/104.2, 311, 310, 341, 194.2, 253.2,
455/293; 375/308, 298, 322, 302, 315,
375/271, 273, 279, 323, 223, 268, 269
See application file for complete search history.

(56) References Cited

U.S. PATENT DOCUMENTS

| 7,580,684 | B2* | 8/2009 | Cyr | H04B 1/40 |
| | | | | 455/311 |
| 7,747,228 | B2* | 6/2010 | Kasha | H04B 1/04 |
| | | | | 455/127.1 |
| 7,750,733 | B2* | 7/2010 | Sorrells | H04B 1/04 |
| | | | | 455/341 |
| 2005/0152469 | A1* | 7/2005 | Fusco | H04L 27/36 |
| | | | | 375/295 |
| 2019/0278155 | A1 | 9/2019 | Plascak et al. | |
| 2021/0391853 | A1* | 12/2021 | Jann | H03B 27/00 |

OTHER PUBLICATIONS

Wu, X., et al., "Dynamic Waveform Shaping With Picosecond Time Widths," IEEE Journal of Solid-State Circuits, vol. 52, No. 2, pp. 389-405, Feb. 2017.

Zong, Z., et al., "A 60 GHz Frequency Generator Based on a 20 GHz Oscillator and an Implicit Multiplier," IEEE Journal of Solid-State Circuits, vol. 51, No. 5, pp. 1261-1273, May 2016.

Wu, X., et al., "Dynamic Waveform Shaping for Reconfigurable Radiated Periodic Signal Generation with Picosecond Time widths," IEEE Custom Integrated Circuits Conference, Oct. 18, 2020.

* cited by examiner

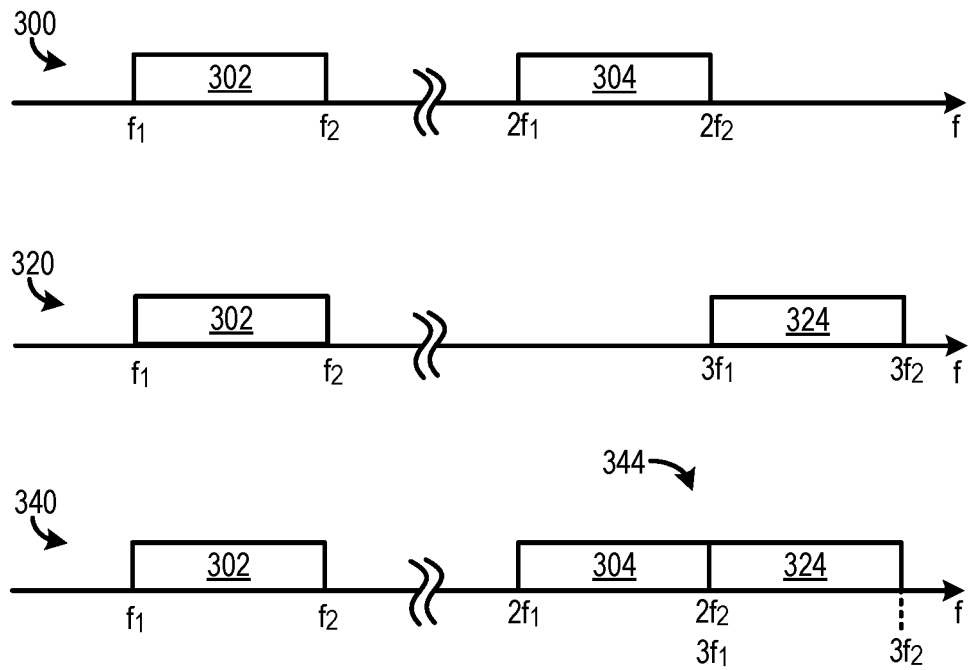
FIG. 3
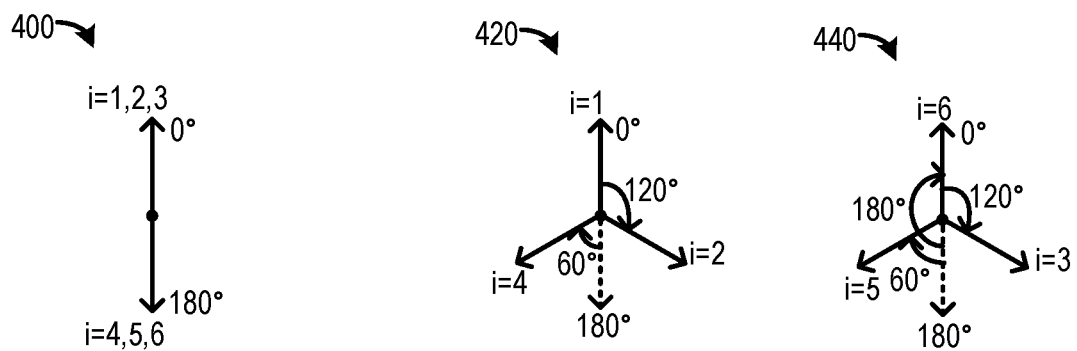
FIG. 4A
FIG. 4B

BROADBAND SIGNAL SOURCE ARCHITECTURE

CROSS REFERENCE TO RELATED APPLICATION(S)

This application claims the benefit of U.S. Provisional Application No. 62/879,692, filed Jul. 29, 2019, which is incorporated by reference as if disclosed herein in its entirety.

GOVERNMENT LICENSE RIGHTS

This invention was made with government support under NSF grant number 1445042, awarded by the National Science Foundation. The government has certain rights in the invention.

FIELD

The present disclosure relates to a broadband signal source, in particular to, a broadband signal source architecture.

BACKGROUND

Millimeter (mm) and/or sub-millimeter wavelength signals may be used in security screening, high-speed data communication and rotational spectroscopy. Rotational spectroscopy may be used for detecting gas molecules. For example, rotational spectroscopy can be used to monitor for gas leaks, human breath and air quality. With advances in integrated circuit (IC) fabrication technology, relatively low cost and relatively highly integrated ICs can be realized as sources and/or detectors for various mm and sub-mm (i.e., terahertz (THz)) applications.

It may be appreciated that signal generation over a broad frequency range is relatively challenging. Generally, ICs can either provide high power over a narrow bandwidth or low power over a wide bandwidth. Thus, at least one of an amount of output power, a resolution and an accuracy of frequency generation over a wide frequency range for mm and sub-mm wavelength signals may be limited. For example, mm and sub-mm signal sources may be working close to their maximum operating frequency with limited output power capability and gain. In another example, tuning (i.e., varying) the on chip signal generation over a wide bandwidth typically results in very high phase noise because of the on-chip passive component losses.

SUMMARY

In an embodiment, there is provided a broadband signal source. The broadband signal source includes a number, n, signal paths and a combiner circuitry. Each signal path, i, includes a programmable phase shifter circuitry, an amplifier circuitry and a harmonic generation circuitry. The programmable phase shifter circuitry is configured to phase shift a path input signal by a respective phase angle, $\theta_i$. The path input signal corresponds to a source input signal having a fundamental frequency, f, and an input signal bandwidth. The amplifier circuitry is configured to amplify the phase shifted path input signal. The harmonic generation circuitry is configured to generate a path output signal including a plurality of harmonics of the amplified phase shifted path input signal. The combiner circuitry is configured to combine the number, n, path output signals to produce a broadband output signal having an output signal center frequency greater than the input signal fundamental frequency and an output signal bandwidth greater than the input signal bandwidth.

In some embodiments, the broadband signal source may further include a splitter circuitry configured to split the source input signal into the number, n, path input signals.

In some embodiments, the broadband signal source may further include an input signal source configured to provide the source input signal.

In some embodiments of the broadband signal source, a fractional bandwidth of the output signal is greater than a fractional bandwidth of the source input signal.

In some embodiments of the broadband signal source, each programmable phase shifter circuitry comprises a respective cascade of same phase shift elements.

In some embodiments of the broadband signal source, the splitter circuitry is configured to differentially split the source input signal into two groups of path input signals, a first group in phase with the source input signal and a second group 180° out of phase with the source input signal.

In some embodiments of the broadband signal source, the output signal bandwidth is twice the input signal bandwidth.

In some embodiments of the broadband signal source, the output signal bandwidth is three times the input signal bandwidth.

In some embodiments of the broadband signal source, the source input signal bandwidth has a frequency range extending from a first frequency, $f_1$, to a second frequency, $f_2$, $f_2$ is equal to 1.5 times $f_1$, and the output signal bandwidth is $2f_1$ to $3f_2$.

In some embodiments of the broadband signal source, the source input signal bandwidth is 80 gigahertz (GHz) to 120 GHz and the output signal bandwidth is 160 GHz to 360 GHz.

In an embodiment, there is provided a method of broadband signal generation. The method includes, for each signal path, i, of a number, n, signal paths: phase shifting, by a programmable phase shifter circuitry, a path input signal by a respective phase angle, $\theta_i$, amplifying, by an amplifier circuitry, the phase shifted path input signal, and generating, by a harmonic generation circuitry, a path output signal. The path input signal corresponds to a source input signal having a fundamental frequency, f, and an input signal bandwidth. The path output signal includes a plurality of harmonics of the amplified phase shifted path input signal. The method further includes combining, by a combiner circuitry, the number, n, path output signals to produce a broadband output signal having an output signal center frequency greater than the input signal fundamental frequency and an output signal bandwidth greater than the input signal bandwidth.

In some embodiments, the method may further include splitting, by a splitter circuitry, the source input signal into the number, n, path input signals.

In some embodiments, the method may further include providing, by an input signal source, the source input signal.

In some embodiments of the method, a fractional bandwidth of the output signal is greater than a fractional bandwidth of the source input signal.

In some embodiments of the method, each programmable phase shifter circuitry includes a respective cascade of same phase shift elements.

In some embodiments, the method may further include differentially splitting, by the splitter circuitry, the source input signal into two groups of path input signals, a first group in phase with the source input signal and a second group 180° out of phase with the source input signal.

In some embodiments of the method, the output signal bandwidth is twice the input signal bandwidth.

In some embodiments of the method, the output signal bandwidth is three times the input signal bandwidth.

In some embodiments of the method, the source input signal bandwidth has a frequency range extending from a first frequency, $f_1$, to a second frequency, $f_2$, $f_2$ is equal to 1.5 times $f_1$, and the output signal bandwidth is $2f_1$ to $3f_2$.

In some embodiments of the method, the source input signal bandwidth is 80 gigahertz (GHz) to 120 GHz and the output signal bandwidth is 160 GHz to 360 GHz.

BRIEF DESCRIPTION OF THE DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings, wherein:

FIG. 3 illustrates input/output signal bandwidth diagrams according to various embodiments of the present disclosure;

FIGS. 4A and 4B illustrate phase diagrams for extracting second and third harmonics of an input signal according to an example embodiment of the present disclosure.

DETAILED DESCRIPTION

Generally, this disclosure relates to a broadband signal source architecture. A broadband signal source, according to the present disclosure, includes a plurality of signal paths. Each signal path includes a respective programmable phase shifter, amplifier circuitry, and harmonic generation circuitry. Each signal path is configured to receive an input signal having a fundamental frequency, f, from an input signal source and to provide a respective phase shifted signal as signal path output signal. Each signal path output signal is configured to include the fundamental frequency of the input signal as well as at least a second and third harmonic. The components (i.e., the fundamental and harmonics) of the signal path output signal are each phase shifted according to the phase of the programmable phase shifter. For example, for a phase shift, $\theta_i$, the phase shift of the $N^{th}$ harmonic is configured to be $N\theta_i$. A respective phase angle (i.e., phase shift) of each phase shifter may be selected based, at least in part, on whether the second or the third harmonic is to be extracted.

The broadband signal source further includes a combiner circuitry configured to combine each signal path output signal. Depending on the respective phase shifts of each harmonic in each signal path output signal, the phase shifted harmonics of a plurality of signal paths may be in phase or out of phase. As is known, combining in phase signals results in a nonzero result while out of phase signals interfere and may cancel one another. Thus, an apparatus, method and/or system, according to the present disclosure, may provide an output signal with a fundamental frequency of two or three times the fundamental frequency of the input signal. In some embodiments, a bandwidth of the output signal may be further enhanced by combining phase shifted contributions from the second and third harmonics, as will be described in more detail below.

Figure 1:
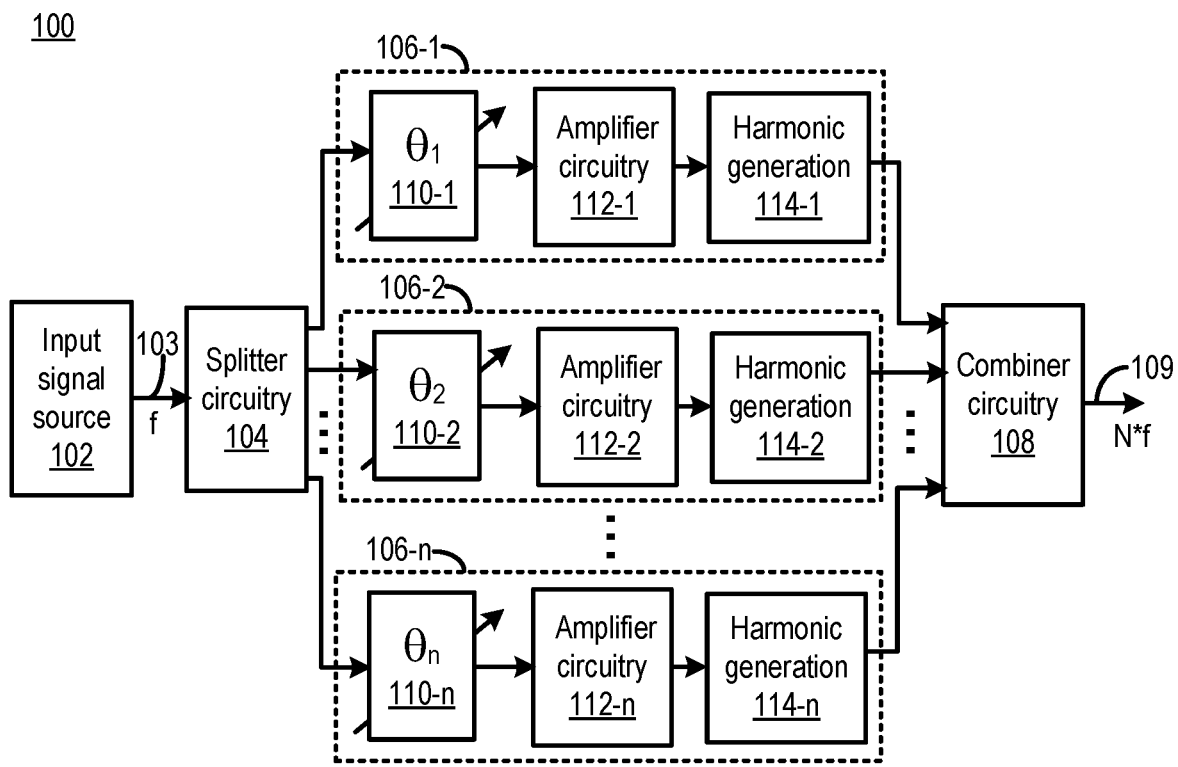
FIG. 1 illustrates a functional block diagram of a broadband signal source consistent with several embodiments of the present disclosure.

FIG. 1 illustrates a functional block diagram of a broadband signal source 100 consistent with several embodiments of the present disclosure. Broadband signal source 100 includes an input signal source 102, splitter circuitry 104, a number, n, of signal paths 106-1, 106-2, . . . , 106-n, and combiner circuitry 108. Input signal source 102 is configured to provide (e.g., generate) an input signal 103 having a fundamental frequency, f. Broadband signal source 100 is configured to produce a broadband output signal 109 including at least one harmonic of the fundamental frequency, f, of the input signal 103.

In an embodiment, a center frequency of the output signal 109 is configured to be greater than the fundamental frequency, f, of the input signal 103 fundamental frequency. In an embodiment, an output signal bandwidth is configured to be greater than an input signal bandwidth. The input signal bandwidth has a frequency range extending from a first frequency, $f_1$, to a second frequency, $f_2$, $f_2$ greater than $f_1$. Thus, the input signal may have an input signal bandwidth (e.g., $f_1$ to $f_2$, where $f_1 < f_2$) and the output signal may have an output signal bandwidth. In one example, the output signal may have a center frequency 2f and a bandwidth of $2f_1$ to $2f_2$. In this example, the center frequency of the output signal corresponds to a second harmonic of the input signal. In another example, the output signal may have a center frequency of 3f and a bandwidth of $3f_1$ to $3f_2$. In this example, the center frequency of the output signal corresponds to a third harmonic of the input signal. In another example, the output signal bandwidth may correspond to $2f_1$ to $3f_2$ with a center frequency between $2f_1$ and $3f_2$. In this example, for a continuous output signal bandwidth, $f_1$ and $f_2$ may be related as $f_2 \geq 1.5 f_1$, as will be described in more detail below.

Thus, the output signal center frequency is related to the number of signal paths, the respective phase shift of each signal path and the input signal fundamental frequency. The output signal bandwidth is related to the number of signal paths, the respective phase shift of each signal path and the input signal bandwidth.

Splitter circuitry 104 is configured to receive the input signal 103 and to split the input signal 103 across the plurality of signal paths 106-1, 106-2, . . . , 106-n. The splitting may be in phase or may be differential. When the splitting is in phase, each signal path may receive a respective signal path input signal that is in phase with the input signal 103. When the splitting is differential, a portion of the signal paths may receive a first signal path input signal that is in phase relative to the input signal 103 and a portion of the signal paths may receive a second signal path input signal that is 180° out of phase relative to the input signal 103. The frequency of each signal path input signal corresponds to the frequency, f, of the input signal 103.

Each signal path 106-1, 106-2, . . . , 106-n includes a respective programmable phase shifter circuitry 110-1, 110-2, . . . , 110-n, a respective amplifier circuitry 112-1, 112-2, . . . , 112-n, and a respective harmonic generation circuitry 114-1, 114-2, . . . , 114-n, coupled in series. Each programmable phase shifter circuitry 110-1, 110-2, . . . , 110-n has an associated programmable phase shift $\theta_1$, $\theta_2$, . . . , $\theta_n$, respectively. It may be appreciated that each phase shift $\theta_1, \theta_2, \ldots, \theta_n$ is relative to the input signal. Each programmable phase shift may be selected based, at least in part, whether the output signal 109 is configured to correspond to the second and/or third harmonic of the input signal 103. Each programmable phase shift may be selected based, at least in part, on the number of signal paths 106-1, 106-2, ..., 106-n included in the broadband signal source 100. Thus, each programmable phase shifter circuitry 110-1, 110-2, ..., 110-n is configured to phase shift a received signal path input signal relative to the input signal 103.

The phase shifted signal may then be amplified by a respective amplifier circuitry 112-1, 112-2, ..., 112-n. A bandwidth of each amplifier circuitry 112-1, 112-2, ..., 112-n may correspond to a bandwidth of the input signal 103. It may be appreciated that the bandwidth of the input signal 103 is configured to be less than the bandwidth of the output signal 109.

Each harmonic generation circuitry 114-1, 114-2, ..., 114-n is configured generate one or more harmonics of the respective received amplified phase shifted signal. A phase shift of each harmonic is related to the particular harmonic. In other words, a phase shift of an $N^{th}$ harmonic may correspond to N times the phase shifter phase shift, $\theta_i$, for that signal path. Thus, the phase shift of the $N^{th}$ harmonic may be determined as $N*\theta_i$.

Combiner circuitry 108 is configured to combine the received amplified phase shifted signals (and their corresponding harmonics) to generate the output signal 109. Depending on the relative phases of the harmonics between signal paths, the harmonics may constructively or destructively interfere, thus, the frequencies (i.e., center frequency and bandwidth) of the output signal 109 are based, at least in part, on the programmable phase shifts and are based, at least in part, on the number of signal paths. For example, the output signal 109 may include a second and/or third harmonic of the input signal 103.

Figure 2A:
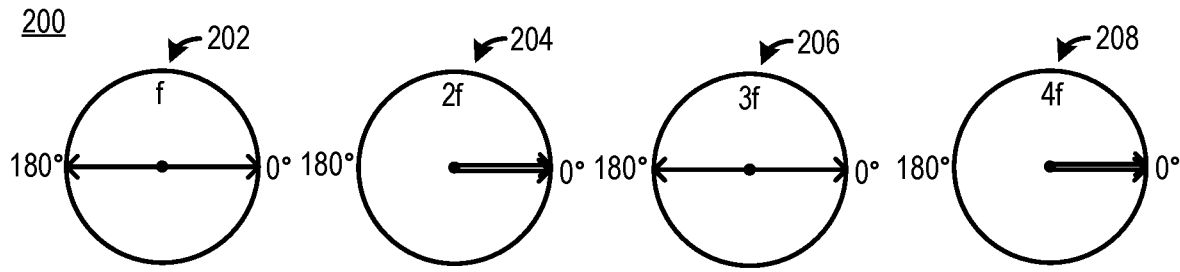
FIGS. 2A and 2B illustrate two example phase diagrams according to various embodiments of the present disclosure.
Figure 2B:
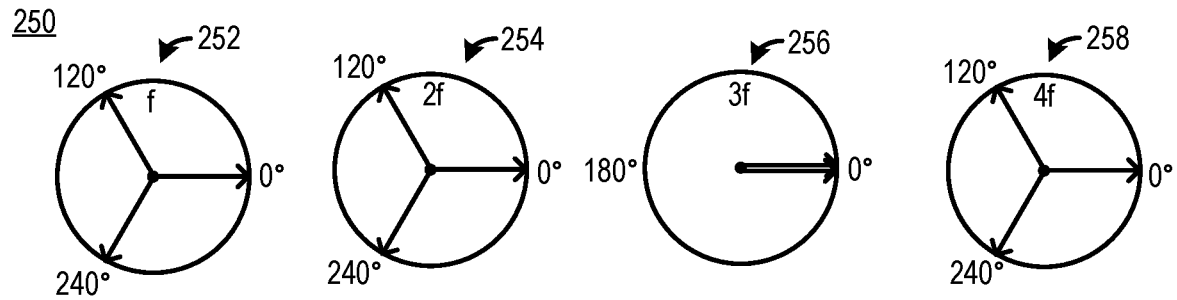

FIGS. 2A and 2B illustrate two example phase diagrams 200, 250 according to various embodiments of the present disclosure. The example phase diagrams 200, 250 illustrate extraction of selected harmonics via selection of the respective phase shift, $\theta_i$, for each of a selected number of signal paths, n. Thus, example phase diagrams 200, 250 illustrate harmonic extraction via selection of the phase shifts $\theta_1, \theta_2, \ldots, \theta_n$ implemented by programmable phase shifter circuitries 110-1, 110-2, ..., 110-n for selected signal paths.

Turning first to FIG. 2A, example phase diagram 200 illustrates extraction of even harmonics of input signal 103. Example phase diagram 200 includes the fundamental frequency (f) 202, the second harmonic (2f) 204, third harmonic (3f) 206, and fourth harmonic (4f) 208. In this example 200, the number of signal paths is two, e.g., signal path 106-1 and signal path 106-2. Thus, the number of phase shifters (e.g., phase shifters 110-1, 110-2) is two with corresponding phase angles $\theta_1$ and $\theta_2$. Continuing with this example 200, the phase angles, $\theta_1$ and $\theta_2$, are selected to be 0° and 180°, respectively. The phase angle of each harmonic may then correspond to the selected phase angle multiplied by the order of the harmonic. For example, the resulting phase angle for the second harmonic (2f) is configured to be 2 times the selected phase angle.

Thus, for the fundamental frequency (f) 202, the two phase angles $\theta_1$ and $\theta_2$ of the fundamental frequency for the two signal paths 106-1, 106-2 equal 0° and 180°. The phase angles for the second harmonic (2f) 204 for each signal path are two times the respective selected phase angle, i.e., 0° and 0° (=360°=2*180°). Similarly, the phase angles for the third harmonic (3f) 206 for each signal path 106-1, 106-2 are 0° and 180° (=540°=3*180°) and the phase angles for the fourth harmonic (4f) 208 for each signal path 106-1, 106-2 are 0° and 0° (=720°=4*180°). Thus, the odd harmonics of the two signal paths 106-1, 106-2 cancel (i.e., destructively interfere) and the even harmonics of the two signal paths 106-1, 106-2 add. Thus, the output signal 109 may include a frequency component corresponding to the second harmonic, i.e., 2f.

Turning now to FIG. 2B, example phase diagram 250 illustrates extraction of odd harmonics of input signal 103. Example phase diagram 250 includes the fundamental frequency (f) 252, the second harmonic (2f) 254, third harmonic (3f) 256, and fourth harmonic (4f) 258. In this example 250, the number of signal paths is three. Thus, the number of phase shifters is three with corresponding phase angles $\theta_1, \theta_2$ and $\theta_3$. Continuing with this example 250, the phase angles $\theta_1, \theta_2$ and $\theta_3$, are selected to be 0°, 120° and 240°, respectively.

Thus, for the fundamental frequency (f) 252, the three phase angles $\theta_1, \theta_2$ and $\theta_3$ of the fundamental frequency for the three signal paths equal 0°, 120° and 240°. The phase angles for the second harmonic (2f) 254 for each signal path are two times the respective selected phase angle, i.e., 0°, 120° (=2*240°) and 240° (=2*120°). Similarly, the phase angles for the third harmonic (3f) 256 for each signal path are 0°, 0° (=3*120°) and 0° (=3*240°) and the phase angles for the fourth harmonic (4f) 258 for each signal path are 0°, 120° and 240°. Thus, the first, second and fourth harmonics of the three signal paths cancel and the third harmonics of the three signal paths add. Thus, the output signal 109 may include a frequency component corresponding to the third harmonic, i.e., 3f.

Thus, through selection of number of signal paths and corresponding phase shifter phase angles, a second and/or a third harmonic may be extracted, resulting in an output signal 109 having an output frequency that is double and/or triple the frequency of the input signal 103. Thus, the center frequency of the output signal 109 may correspond to double and/or triple the fundamental frequency of the input signal 103 and the bandwidth of the output signal 109 may correspond to two, three or more times the bandwidth of the input signal 103.

FIG. 3 illustrates input/output signal bandwidth diagrams 300, 320, 340 according to various embodiments of the present disclosure. In each diagram 300, 320, 340, the horizontal axis corresponds to frequency and each rectangle is configured to indicate signal bandwidth. Thus, in each diagram 300, 320, 340, an input signal bandwidth 302 with a frequency range $f_1$ to $f_2$ corresponds to the input signal, e.g., input signal 103 of FIG. 1. The first input/output bandwidth diagram 300 represents extraction of the second harmonic. A first output bandwidth 304 of the first diagram 300 thus corresponds to the frequency range $2f_1$ to $2f_2$. Similarly, a second output bandwidth 324 of the second input/output bandwidth diagram 320 represents extraction of the third harmonic. The second output bandwidth 324 thus corresponds to the frequency range $3f_1$ to $3f_2$.

A third input/output bandwidth diagram 340 represents extraction of both the second harmonic and the third harmonic. Whether an output bandwidth 344 of the third diagram 340 is continuous is related to the relative values of the frequencies $f_1$ and $f_2$ that bound the input bandwidth. A minimum frequency of the output bandwidth is $2f_1$ (constrained by the low-frequency bound of the input signal bandwidth) and a maximum frequency of the output signal bandwidth is $3f_2$ (constrained by the high-frequency bound of the input signal bandwidth). The output bandwidth is continuous when $3f_1$ is less than or equal to $2f_2$. In other words, the output bandwidth 344 is continuous when the second and third harmonics are extracted if $f_2 \geq 1.5 f_1$. Thus, $f_2=1.5f_1$ provides a minimum input signal bandwidth that may support an increased output signal bandwidth 344 using harmonic reconfiguration, as described herein. It may be appreciated that when $f_2=1.5f_1$, the output signal bandwidth 344 corresponds to a combination of bandwidths 304 and 324.

A fractional bandwidth (i.e., bandwidth divided by center frequency) of the input signal 302 when $f_2=1.5f_1$ is 40%. Fractional bandwidths of the output signals 304 and 324 are also 40%. The fractional bandwidth of the output signal 344 is 76.9%. For example, for $f_1$ equal to 80 gigahertz (GHz) and $f_2$ equal to 120 GHz, the output frequency range is 160 GHz to 360 GHz (i.e., $2f_1$ to $3f_2$). It may be appreciated that such output frequency range may be useful for rotational spectroscopy, for example. Advantageously, the output signal fractional bandwidth (e.g., 76.9%) may be achieved with a lesser input fractional bandwidth (e.g., 40%) and a corresponding lesser amplifier bandwidth.

FIGS. 4A and 4B illustrate phase diagrams for extracting second and third harmonics of an input signal according to an example embodiment of the present disclosure. For example, the phase diagrams of FIGS. 4A and 4B may correspond to input/output signal bandwidth diagram 340 of FIG. 3.

FIG. 4A illustrates a first phase diagram 400 for extracting a second harmonic. FIG. 4B illustrates a second phase diagram 420 and a third phase diagram 440 for extracting a third harmonic. The second and third phase diagrams 420, 440 are shown separately for ease of illustration. The corresponding extraction of the third harmonic may be implemented in one embodiment of a broadband signal source, according to the present disclosure. A broadband signal source, consistent with the present disclosure, may be configured to implement both second harmonic and third harmonic extraction. The broadband signal source configuration parameters may include the number, n, of signal paths and the respective phase shift of the programmable phase shifter included in each signal path.

It may be appreciated that when the output bandwidth is greater than the input bandwidth, as described herein, a power combining network, i.e., combiner circuitry, may be implemented by a passive current and/or a passive voltage combining technique. Efficiency of such a power combining network may be enhanced by symmetry associated with the signal input to the power combining network. As described herein, the signals input to the combiner circuitry correspond to output signals of the signal paths. To extract second harmonics and cancel odd harmonics, a number, n, of signal paths is even and a minimum number of signal paths is two. To extract third harmonics and cancel the first (i.e., fundamental frequency), second and fourth harmonics, a number of signal paths, n, is 3 m, where m=1, 2, 3. Thus, to extract both the second and third harmonics and to support enhancing symmetry in a broadband signal source, the number of signal paths may be selected to be six (i.e, n=6). In other words, six signal paths (and thus six programmable phase angles) corresponds to a minimum number of signal paths that satisfy both the condition of an even number of signal paths and the condition that the number of signal paths be equal to 3 m, where m is an integer.

In an embodiment, the input signal, e.g., input signal 103, may be split (e.g., by splitter circuitry 104) differentially into two groups of path input signals. The first group of path input signals is configured to be in phase with the input signal 103 and the second group of path input signals is configured to be 180° out of phase with the input signal. Each path input signal may be provided to a respective signal path, i, for a total of six paths (i=1, 2, 3, 4, 5, 6) with each path, i, configured to implement a respective phase shift, $\theta_i$, i=1, 2, 3, 4, 5, 6. Thus, the first group of path input signals may correspond to i=1, 2, 3 and the second group of path input signals may correspond to i=4, 5, 6.

Turning now to FIG. 4A, first phase diagram 400 illustrates resulting phase shifts for each path for extracting the second harmonics. The resulting phase shifts are provided by a combination of the programmable phase shifter as well as the differential split by splitter circuitry. The programmable phase is set to zero for each of the six phase shifters, thus, $\theta_i=0°$, i=1, 2, 3, 4, 5, 6. Thus, the net phase shift for each path in the first group (i=1, 2, 3) is 0°. The net phase shift for each path in the second group (i=4, 5, 6) is 180°, provided by the differential split by the splitter circuitry.

Turning now to FIG. 4B, the second and third phase diagrams 420, 440 illustrate resulting phase shifts for each path for extraction of the third harmonics. Each phase shifter may be programmed to implement a respective phase shift: $\theta_i=0°$, 120°, 120°, 60°, 60°, 180°, for i=1, 2, 3, 4, 5, 6, respectively. The second phase diagram 420 illustrates the net phase shift for paths 1, 2 and 4 and the third phase diagram 440 illustrates the net phase shift for paths 3, 5 and 6. Thus, the net phase shift, in path order (i=1, 2, 3, 4, 5, 6) are 0°, 120°, 120°, 240°, 240°, 0°. It may be appreciated that the respective phase shift for each of paths 1, 2 and 3 is achieved via the respective corresponding phase shifter circuitry and that the respective phase shift for each of paths 4, 5, 6 is a combination of the group differential split that contributed 180° phase shift and the contribution from the phase shifter circuitry.

In this example, it may be appreciated that the phase shifts are all multiples of 60° and may thus be achieved by cascading a plurality of same phase shifter element nbhs, with each configured to implement a 60° phase shift to achieve the desired multiple of 60°. The individual phase shifter circuitries may then be optimized for bandwidth and accuracy over a target frequency range, for example 80 GHz to 120 GHz.

Figure 5A:
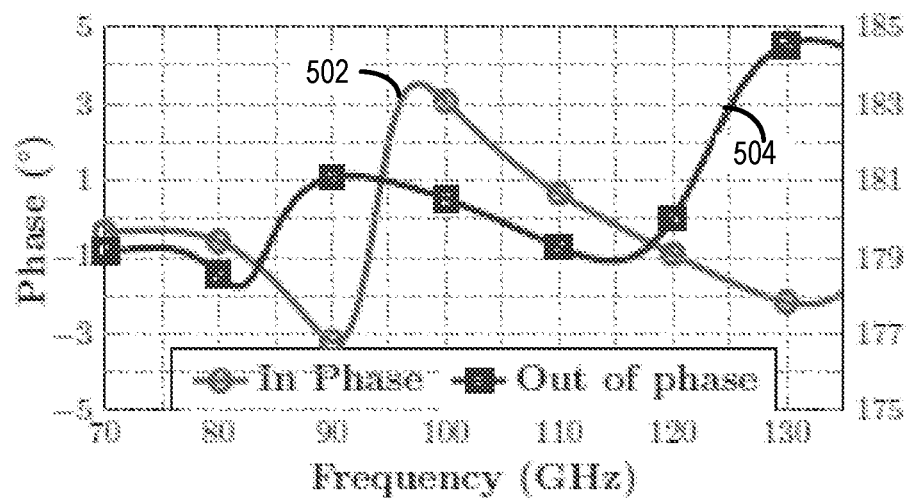
FIGS. 5A and 5B are plots illustrating simulation data for phase shifter circuitries corresponding to FIGS. 4A and 4B.
Figure 5B:
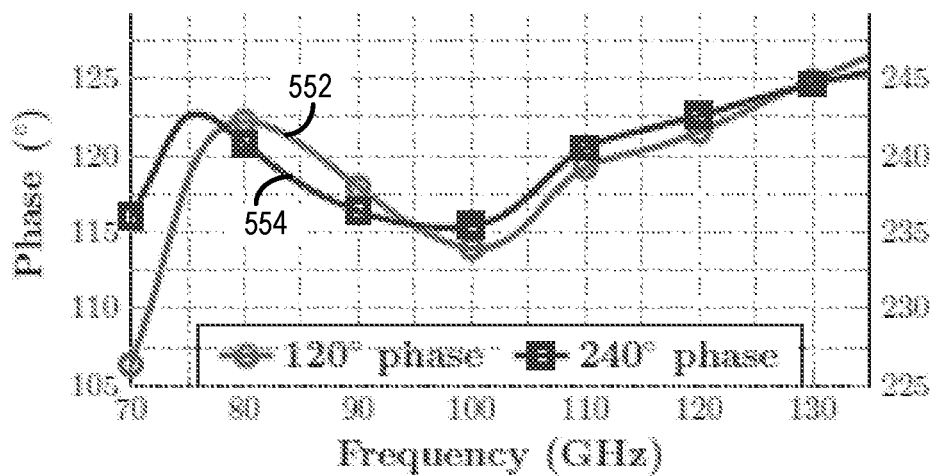

FIGS. 5A and 5B are plots 500, 550 illustrating simulation data for phase shifter circuitries corresponding to FIGS. 4A and 4B. For both FIG. 5A and FIG. 5B, the horizontal axis is frequency in GHz and the vertical axis is phase angle in degrees (°). Plot 500 includes simulation data for in-phase (net phase angle of 0°) 502 and out of phase (net phase angle of 180°) 504. Plot 550 includes simulation data for net phase angle of 120° 552 and net phase angle of 240°) 554.

Thus, a broadband signal source, according to the present disclosure, includes a plurality of signal paths. Each signal path includes a respective programmable phase shifter, amplifier circuitry, and harmonic generation circuitry. Each signal path is configured to receive an input signal having a fundamental frequency, f, from an input signal source and to provide a respective phase shifted signal as signal path output signal. Each signal path output signal is configured to include the fundamental frequency of the input signal as well as at least a second and third harmonic. The components (i.e., the fundamental and harmonics) of the signal path output signal are each phase shifted according to the phase of the programmable phase shifter. For example, for a phase shift, $\theta_i$, the phase shift of the $N^{th}$ harmonic is configured to be $N\theta_i$. A respective phase angle (i.e., phase shift) of each phase shifter may be selected based, at least in part, on whether the second or the third harmonic is to be extracted.

The broadband signal source further includes a combiner circuitry configured to combine each signal path output signal. Depending on the respective phase shifts of each harmonic in each signal path output signal, the phase shifted harmonics of a plurality of signal paths may be in phase or out of phase. Thus, an apparatus, method and/or system, according to the present disclosure, may provide an output signal with a fundamental frequency of two or three times the fundamental frequency of the input signal. In some embodiments, a bandwidth of the output signal may be further enhanced by combining phase shifted contributions from the second and third harmonics.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A broadband signal source comprising:
   a number, n, signal paths, each signal path, i, comprising:
      a programmable phase shifter circuitry configured to phase shift a path input signal by a respective phase angle, $\theta_i$, the path input signal corresponding to a source input signal having a fundamental frequency, f, and an input signal bandwidth,
      an amplifier circuitry configured to amplify the phase shifted path input signal, and
      a harmonic generation circuitry configured to generate a path output signal comprising a plurality of harmonics of the amplified phase shifted path input signal; and
   a combiner circuitry configured to combine the number, n, path output signals to produce a broadband output signal having an output signal center frequency greater than the input signal fundamental frequency and an output signal bandwidth greater than the input signal bandwidth.

2. The broadband signal source of claim 1, further comprising a splitter circuitry configured to split the source input signal into the number, n, path input signals.

3. The broadband signal source of claim 2, wherein the splitter circuitry is configured to differentially split the source input signal into two groups of path input signals, a first group in phase with the source input signal and a second group 180° out of phase with the source input signal.

4. The broadband signal source of claim 1, further comprising an input signal source configured to provide the source input signal.

5. The broadband signal source of claim 1, wherein a fractional bandwidth of the output signal is greater than a fractional bandwidth of the source input signal.

6. The broadband signal source according to claim 1 to wherein each programmable phase shifter circuitry comprises a respective cascade of same phase shift elements.

7. The broadband signal source according to claim 1, wherein the output signal bandwidth is twice the input signal bandwidth.

8. The broadband signal source according to claim 1, wherein the output signal bandwidth is three times the input signal bandwidth.

9. The broadband signal source according to claim 1, wherein the source input signal bandwidth has a frequency range extending from a first frequency, $f_1$, to a second frequency, $f_2$, $f_2$ is equal to 1.5 times $f_1$, and the output signal bandwidth is $2f_1$ to $3f_2$.

10. The broadband signal source according to claim 1, wherein the source input signal bandwidth is 80 gigahertz (GHz) to 120 GHz and the output signal bandwidth is 160 GHz to 360 GHz.

11. A method of broadband signal generation comprising:
    for each signal path, i, of a number, n, signal paths:
       phase shifting, by a programmable phase shifter circuitry, a path input signal by a respective phase angle, $\theta_i$, the path input signal corresponding to a source input signal having a fundamental frequency, f, and an input signal bandwidth,
       amplifying, by an amplifier circuitry, the phase shifted path input signal, and
       generating, by a harmonic generation circuitry, a path output signal comprising a plurality of harmonics of the amplified phase shifted path input signal; and
    combining, by a combiner circuitry, the number, n, path output signals to produce a broadband output signal having an output signal center frequency greater than the input signal fundamental frequency and an output signal bandwidth greater than the input signal bandwidth.

12. The method of claim 11, further comprising splitting, by a splitter circuitry, the source input signal into the number, n, path input signals.

13. The method of claim 12, further comprising differentially splitting, by the splitter circuitry, the source input signal into two groups of path input signals, a first group in phase with the source input signal and a second group 180° out of phase with the source input signal.

14. The method of claim 11, further comprising providing, by an input signal source, the source input signal.

15. The method of claim 11, wherein a fractional bandwidth of the output signal is greater than a fractional bandwidth of the source input signal.

16. The method according to claim 11, wherein each programmable phase shifter circuitry comprises a respective cascade of same phase shift elements.

17. The method according to claim 11, wherein the output signal bandwidth is twice the input signal bandwidth.

18. The method according to claim 11, wherein the output signal bandwidth is three times the input signal bandwidth.

19. The method according to claim 11, wherein the source input signal bandwidth has a frequency range extending from a first frequency, $f_1$, to a second frequency, $f_2$, $f_2$ is equal to 1.5 times $f_1$, and the output signal bandwidth is $2f_1$ to $3f_2$.

20. The method according to claim 11, wherein the source input signal bandwidth is 80 gigahertz (GHz) to 120 GHz and the output signal bandwidth is 160 GHz to 360 GHz.

* * * * *